United States Patent
Wu et al.

(10) Patent No.: US 9,528,183 B2
(45) Date of Patent: Dec. 27, 2016

(54) COBALT REMOVAL FOR CHAMBER CLEAN OR PRE-CLEAN PROCESS

(71) Applicant: Applied Materials, Inc., Santa Clara, CA (US)

(72) Inventors: Kai Wu, Palo Alto, CA (US); Bo Zheng, Saratoga, CA (US); Sang Ho Yu, Cupertino, CA (US); Avgerinos V. Gelatos, Redwood City, CA (US); Bhushan N. Zope, Santa Clara, CA (US); Jeffrey Anthis, San Jose, CA (US); Benjamin Schmiege, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/255,443

(22) Filed: Apr. 17, 2014

(65) Prior Publication Data
US 2014/0326276 A1  Nov. 6, 2014

Related U.S. Application Data

(60) Provisional application No. 61/818,286, filed on May 1, 2013.

(51) Int. Cl.
*C25F 1/00* (2006.01)
*C23C 16/44* (2006.01)
(Continued)

(52) U.S. Cl.
CPC ......... *C23C 16/4405* (2013.01); *H01J 37/321* (2013.01); *H01J 37/32357* (2013.01); *H01J 37/32862* (2013.01); *B08B 9/00* (2013.01)

(58) Field of Classification Search
CPC ............ B08B 5/00; B08B 7/0035; B08B 9/00; B08B 9/027; C23C 16/4405; H01L 21/32136; H01L 29/66545
See application file for complete search history.

(56) References Cited

U.S. PATENT DOCUMENTS 5,753,567 A * 5/1998 Banan ................... C01B 33/037
                                                                134/1.1
6,225,202 B1   5/2001 Gupta et al.
(Continued)

FOREIGN PATENT DOCUMENTS

KR     1020090020925 A    2/2009
KR       20100036594 A    4/2010

OTHER PUBLICATIONS

International Search Report and Written Opinion for International Application No. PCT/US2014/034541 dated Aug. 21, 2014.
(Continued)

*Primary Examiner* — Bibi Carrillo
(74) *Attorney, Agent, or Firm* — Patterson & Sheridan, LLP (57) ABSTRACT

Implementations described herein generally relate to methods and apparatus for in-situ removal of unwanted deposition buildup from one or more interior surfaces of a semiconductor substrate processing chamber. In one implementation, a method for removing cobalt or cobalt containing deposits from one or more interior surfaces of a substrate processing chamber after processing a substrate disposed in the substrate processing chamber is provided. The method comprises forming a reactive species from the fluorine containing cleaning gas mixture, permitting the reactive species to react with the cobalt and/or the cobalt containing deposits to form cobalt fluoride in a gaseous state and purging the cobalt fluoride in gaseous state out of the substrate processing chamber.

11 Claims, 4 Drawing Sheets

(51) Int. Cl.
*H01J 37/32* (2006.01)
*B08B 9/00* (2006.01)

(56) References Cited

U.S. PATENT DOCUMENTS

| | | | |
|---|---|---|---|
| 6,374,831 B1* | 4/2002 | Chandran | C23C 16/4405 134/1 |
| 6,868,856 B2 | 3/2005 | Nowak et al. | |
| 7,159,597 B2* | 1/2007 | Hua | B08B 7/0035 134/1.1 |
| 7,967,913 B2 | 6/2011 | Hua et al. | |
| 2004/0137749 A1* | 7/2004 | Ying | H01L 43/12 438/710 |
| 2005/0019969 A1* | 1/2005 | Chang | C23C 16/4405 438/30 |
| 2005/0136185 A1 | 6/2005 | Ramanathan et al. | |
| 2006/0051966 A1 | 3/2006 | Or et al. | |
| 2007/0289710 A1* | 12/2007 | Hudson | B08B 7/0035 156/345.38 |
| 2008/0081483 A1* | 4/2008 | Wu | H01J 37/32137 438/714 |
| 2008/0142039 A1* | 6/2008 | Chen | C11D 7/02 134/1.2 |
| 2009/0095989 A1* | 4/2009 | Kim | H01L 29/772 257/259 |
| 2010/0273291 A1 | 10/2010 | Kryliouk et al. | |
| 2011/0079251 A1 | 4/2011 | Kryliouk et al. | |
| 2013/0260555 A1* | 10/2013 | Zope | H01L 21/4846 438/660 |
| 2014/0326276 A1* | 11/2014 | Wu | C23C 16/4405 134/1.1 |
| 2015/0140812 A1* | 5/2015 | Zope | H01L 21/32115 438/669 |
| 2015/0144154 A1* | 5/2015 | Cho | B08B 7/0035 134/1.1 |

OTHER PUBLICATIONS

N. S. Chilingarov et al, Atomic Fluorine in Thermal Reactions Involving Solid TbF4, Journal of Fluorine Chemistry 104 (2000), pp. 291-295.

M. V. Korobov et al, Stabilities of CoF4 and CrF5 in the Gas Phase, J. Chem. Thermodynamics, 1993, 25, pp. 1161-1168.

Juliet V. Rau et al, Identification of Gaseous Cobalt Tetrafluoride: MS and FTIR Spectroscopic Studies, Inorg. Chem., 1999, 38, pp. 5695-5697.

* cited by examiner

COBALT REMOVAL FOR CHAMBER CLEAN OR PRE-CLEAN PROCESS

CROSS-REFERENCE TO RELATED APPLICATIONS

This application claims benefit of U.S. Provisional Patent Application Ser. No. 61/818,286, filed May 1, 2013, which is herein incorporated by reference in its entirety.

BACKGROUND

Field

Implementations described herein generally relate to methods and apparatus for in-situ removal of unwanted deposition buildup from one or more interior surfaces of a semiconductor substrate processing chamber.

Description of the Related Art

Currently, cobalt is a metal of choice for use in multilevel metallization processes that are crucial to device manufacturing, especially for the PMOS work function layers of metal-oxide-semiconductor field-effect transistor (MOSFET) as well as wetting layer for direct metal gap fill and complete gap fill. The multilevel interconnect features that drive the manufacturing processes have high aspect ratio apertures including contacts, vias, lines, gaps, and other features. Filling these features without creating voids or deforming the feature geometry is more difficult when the features have higher aspect ratios. Reliable formation of interconnects is also more difficult as manufacturers strive to increase circuit density and quality.

As the use of cobalt has permeated the marketplace due to a relative low cost and processing properties, manufacturers of semiconductor, solar, and other electronic devices continue to look for ways to increase conductivity while improving surface roughness of the cobalt layer and improving the boundary regions between cobalt and other material layers by reducing cobalt diffusion and agglomeration. Several processing methods including, for example, physical vapor deposition (PVD) and chemical vapor deposition (CVD), have been developed to manufacture interconnects containing cobalt as feature sizes have decreased.

Unwanted deposition of cobalt on the interior surfaces such as the walls and chamber parts of the ALD or CVD processing chambers may occur during cobalt deposition processes. Such unwanted cobalt deposition may create particles and flakes within the chamber, resulting in the drift of process conditions and more importantly affecting the process reproducibility and uniformity.

In order to achieve high chamber availability while reducing the cost of ownership for production and maintaining film quality, a chamber clean is required to remove cobalt residue from the interior surfaces of the processing chamber including the process kits, e.g., showerhead, etc. Unfortunately, most cobalt compounds are non-volatile which makes cobalt compounds very difficult to remove. Currently, cobalt is removed from processing chambers using ex-situ cleaning processes where production is stopped, the processing chamber is opened, and the chamber parts are removed for cleaning using wet-clean processes.

Therefore, a need exists for methods for removing unwanted cobalt deposition from substrate processing chambers.

SUMMARY

Implementations described herein generally relate to methods and apparatus for in-situ removal of unwanted deposition buildup from one or more interior surfaces of a semiconductor substrate processing chamber. In one implementation, a method for removing cobalt or cobalt containing deposits from one or more interior surfaces of a substrate processing chamber after processing a substrate disposed in the substrate processing chamber is provided. The method comprises forming a reactive species from the fluorine containing cleaning gas mixture, permitting the reactive species to react with the cobalt and/or the cobalt containing deposits to form cobalt fluoride in a gaseous state and purging the cobalt fluoride in gaseous state out of the substrate processing chamber.

In another implementation, a method for removing cobalt or cobalt containing deposits from one or more interior surfaces of a substrate processing chamber after processing a substrate disposed in the substrate processing chamber is provided. The method comprises flowing a fluorine containing cleaning gas mixture into a remote plasma source fluidly coupled with the substrate processing chamber, forming reactive species from the fluorine containing cleaning gas mixture and transporting the reactive species into the substrate processing chamber, permitting the reactive species to react with the cobalt and/or the cobalt containing deposits to form cobalt fluoride in a gaseous state and purging the cobalt fluoride in gaseous state out of the substrate processing chamber.

In yet another implementation, a method for removing cobalt or cobalt containing deposits from one or more interior surfaces of a substrate processing chamber after processing a substrate disposed in the substrate processing chamber is provided. A reactive species is formed from a fluorine containing cleaning gas mixture. The reactive species are permitted to react with the cobalt and/or the cobalt containing deposits to form cobalt fluoride in a gaseous state. The cobalt fluoride in gaseous state is purged out of the substrate processing chamber. The fluorine containing cleaning gas mixture may comprise a fluorine containing gas selected from the group consisting of: $NF_3$, $ClF_3$, $F_2$, and combinations thereof. The cobalt fluoride may be selected from the group consisting of $Co(II)F_2$, $Co(III)F_3$, $Co(IV)F_4$, $CoNOF_x$, and combinations thereof. The fluorine containing cleaning gas mixture may further comprise an oxygen containing gas. The oxygen containing gas may be selected from the group consisting of: $N_2O$, $O_2$, and combinations thereof. The fluorine containing cleaning gas may comprise $NF_3$ and $N_2O$. The fluorine containing cleaning gas may comprise $NF_3$ and $O_2$. The fluorine containing gas may further comprise an inert gas selected from the group consisting of: helium, argon, and combinations thereof. The method may further comprise forming the reactive species in a remote plasma source. The method may further comprise thermally activating the reactive species in a remote plasma source. The reactive species may comprise atomic fluorine.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein generally relate to methods and apparatus for in-situ removal of unwanted deposition buildup from one or more interior surfaces of a semiconductor substrate processing chamber. In some implementations, in-situ or remote fluorine containing gas mixtures have been used to remove unwanted cobalt and/or cobalt containing deposits from the substrate processing chamber. In some implementations, the fluorine containing gas mixtures comprise $NF_3$ and $N_2O$ or $NF_3$ and $O_2$ or $NF_3$ only in plasma to remove the unwanted cobalt and/or cobalt containing deposits from the substrate processing chamber. Since both atomic F and O have relatively long lifetimes, it is possible to use remote plasma with a mixture of $NF_3$ and $N_2O$, or $NF_3$ and $O_2$ for removing unwanted cobalt deposits from a substrate processing chamber. Some implementations may be used for pre-clean of cobalt film for ex-situ cobalt deposition between contact level to M1 or M1 to M2, or between PVD cobalt flush process on one cluster tool and cobalt film on another cluster tool.

The term "substrate" as used herein refers to a layer of material that serves as a basis for subsequent processing operations and includes a surface to be disposed for forming a contact metal layer thereon. The substrate may be a material such as crystalline silicon (e.g., Si<100> or S<111>), silicon oxide, strained silicon, silicon germanium, doped or undoped polysilicon, doped or undoped silicon wafers, patterned or non-patterned wafers silicon on insulator (SOI), carbon doped silicon oxides, silicon nitride, doped silicon, germanium, gallium arsenide, glass, or sapphire. The substrate can also include one or more nonconductive materials, such as silicon, silicon oxide, doped silicon, germanium, gallium arsenide, glass, and sapphire. The substrate can also include dielectric materials such as silicon dioxide, organosilicates, and carbon doped silicon oxides. Further, the substrate can include any other materials such as metal nitrides and metal alloys, depending on the application.

Figure 1:
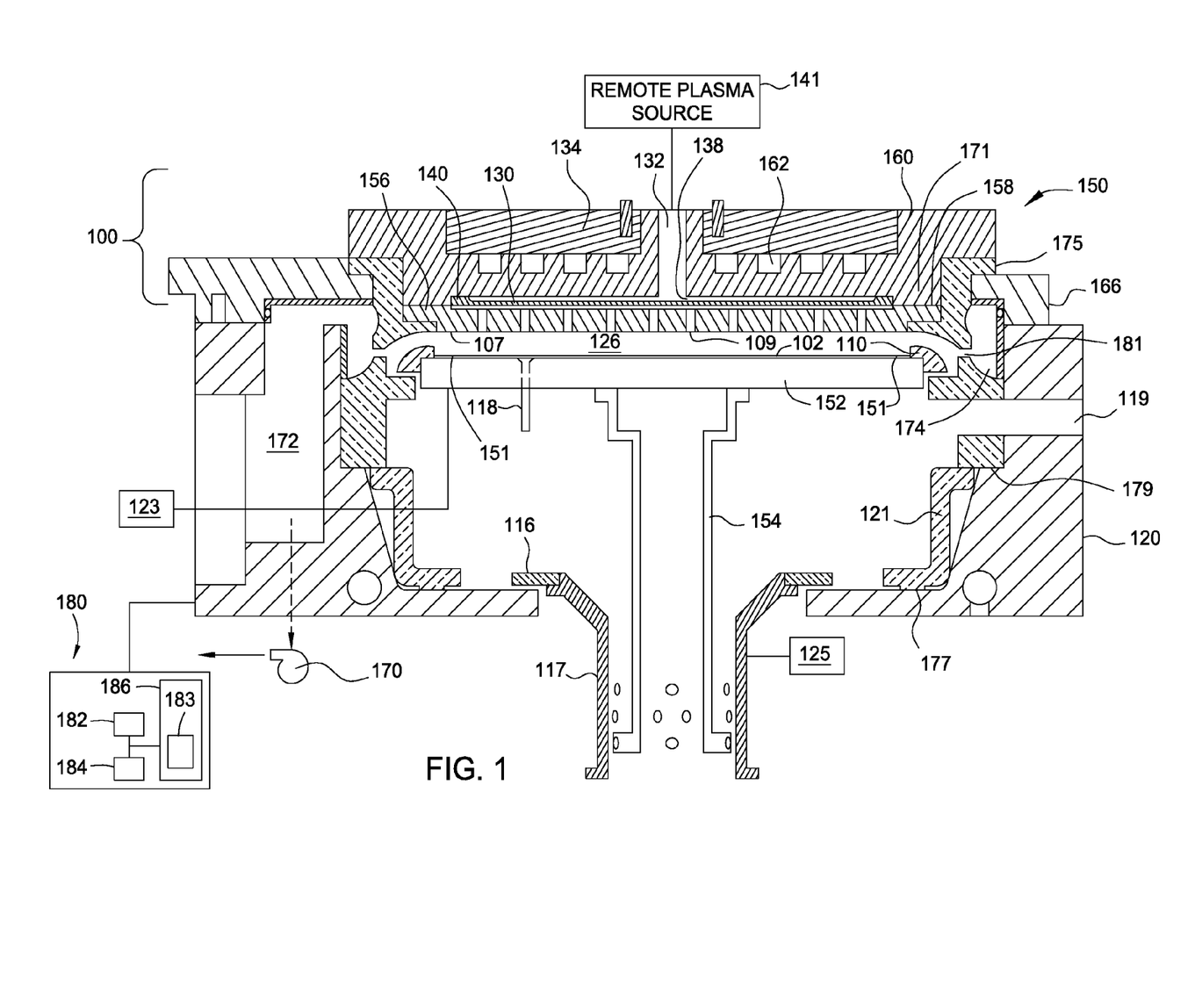
FIG. 1 is a schematic illustration of an exemplary metal deposition processing system that may be cleaned using the methods described herein.

FIG. 1 illustrates a processing chamber 150 that may be used to form contact metal materials by vapor deposition processes and cleaned according to implementations described herein. The contact metal materials may contain metallic cobalt, metallic nickel, derivatives thereof, or combinations thereof. The processing chamber 150 may be used to perform CVD, plasma enhanced-CVD (PE-CVD), pulsed-CVD, ALD, PE-ALD, derivatives thereof, or combinations thereof.

Water channels, such as a convolute liquid channel 162, may be used to regulate the temperature of a lid assembly 100 during the vapor deposition process for depositing a cobalt-containing material and during the cleaning process described herein. In some implementations during the deposition process, the lid assembly 100 may be heated or maintained at a temperature within a range from about 20° C. to about 300° C., preferably, from about 30° C. to about 100° C., and more preferably, from about 45° C. to about 65° C. The temperature is maintained during the vapor deposition process of a cobalt-containing material and/or nickel containing material. In some implementations during the cleaning process, the lid assembly 100 may be heated or maintained at a temperature within a range from about 65° C. to about 400° C., preferably, from about 100° C. to about 300° C., and more preferably, from about 150° C. to about 200° C. The temperature of the lid assembly 100 may be maintained at a low temperature during the depositions process, increased during the cleaning process and reduced before deposition commences again.

A showerhead 156 has a relatively short upwardly extending rim 158 screwed to a gas box plate 160. Both the showerhead 156 and the gas box plate 160 may be formed from or contain a metal, such as aluminum, stainless steel, or alloys thereof. The convolute liquid channel 162 is formed in the top of the gas box plate 160 and covered and sealed by a water cooling cover plate 134. Water is generally flown through the convolute liquid channel 162. However, alcohols, glycol ethers, and other organic solvents may be used solely or mixed with water to transfer heat away from or to the lid assembly 100. The convolute liquid channel 162 is formed in a serpentine though generally circumferential path having bends (e.g., three sharp U-turns or U-shaped bends) as the path progresses from the inside to the outside until the path returns to the inside in a radial channel (not shown). The convolute liquid channel 162 is narrow enough to ensure that the flow of water becomes turbulent, thus aiding the flow of heat from the flange of the gas box plate 160 to the water in the convolute liquid channel 162. A liquid temperature regulating system (not shown) may be attached to the convolute liquid channel 162 and used to transfer heat away from or to lid assembly 100. In one example, the lid assembly 100 is configured to be heated or maintained at a temperature of about 150° C. and is in fluid communication with a source of a cobalt precursor, such as dicobalt hexacarbonyl butylacetylene "CCTBA," a source of a hydrogen precursor, such as $H_2$, and cleaning gases as described herein.

The extending rim 158 of the showerhead 156 is attached to the bottom rim 171 of the gas box plate 160. Both rims 158 and 171 are maximally sized between encompassing a lid isolator 175 and an encompassed lower cavity 130 of the showerhead 156. A screw fastening between the showerhead 156 and the gas box plate 160 ensures good thermal contact over the maximally sized contact area. The thermal flow area extends from the outside at the lid isolator 175 (except for a gap between the lid isolator 175 and either the showerhead 156 or the gas box plate 160) to the inside at a lower cavity 130. The structure of the convolute liquid channels 162 provides efficient thermal transfer between the water and the gas box plate 160. The mechanical interface between the flange of gas box plate 160 and showerhead 156 ensures efficient thermal transfer between the gas box plate 160 and the showerhead 156. Accordingly, cooling of the showerhead 156 is greatly enhanced.

The processing chamber 150 further contains a heater pedestal 152 connected to a pedestal stem 154 that may be vertically moved within the processing chamber 150. The heater portion of the heater pedestal 152 may be formed of a ceramic material or aluminum. In its upper deposition position, the heater pedestal 152 holds a substrate 102 in close opposition to a lower surface 107 of the showerhead 156. A processing region 126 is defined between the heater pedestal 152 and the lower surface 107 of the showerhead 156. The showerhead 156 has a plurality of apertures or holes 109 communicating between the lower cavity 130 and the processing region 126 to allow for the passage of processing gas. The processing gas is supplied through the gas port 132 formed at the center of the water-cooled gas box plate 160 which is made of aluminum. The upper side of the gas box plate 160 is covered by a water cooling cover plate 134 surrounding the upper portion of the gas box plate 160 that includes a gas port 132. The gas port 132 supplies the processing gases to an upper cavity 138, which is separated from the lower cavity 130 by a blocker plate 140. The blocker plate 140 has a large number of holes 109 disposed therethrough. In one implementation, the cavities 130 and 138, showerhead 156, and blocker plate 140 evenly distribute the processing gas over the upper face of the substrate 102.

The substrate 102 may be supported on the heater pedestal 152, which is illustrated in a raised, deposition position. In a lowered, loading position, a lifting ring 116 is attached to a lift tube 117, which lifts four lift pins 118. The lift pins 118 fit to slide into the heater pedestal 152 so that the lift pins 118 can receive the substrate 102 loaded into the chamber through a loadlock port 119 in a chamber body 120. In one implementation, the heater pedestal 152 may contain an optional confinement ring 110, such as during plasma-enhanced vapor deposition processes.

A side purge gas source 123 may be coupled to the processing chamber 150 and configured to supply purge gas to an edge portion 151 of the substrate 102 as needed. In one implementation, the gases may be supplied from the side purge gas source 123 to the substrate 102 edge portion 151. The gasses may be a hydrogen gas, argon gas, nitrogen gas, helium gas, combinations thereof, or the like. Furthermore, a bottom purge gas source 125 may also be coupled to the chamber 150 to supply the purge gas from the bottom of the chamber 150 to the substrate 102 surface. Similarly, the purge gas supplied from the bottom purge gas source 125 may include a hydrogen gas, argon gas, nitrogen gas, helium gas, combinations thereof, or the like.

A lid isolator 175 is interposed between showerhead 156 and a lid rim 166, which can be lifted off the chamber body 120 to open the processing chamber 150 for maintenance access. The vacuum within processing chamber 150 is maintained by a vacuum pump 170 connected to a pump plenum 172 within the processing chamber 150, which connects to an annular pumping channel 174.

An annular chamber liner 179 made of quartz is disposed in the processing chamber 150 which defines a side of the annular pumping channel 174 but also partially defines a further choke aperture 181 disposed between the processing region 126 and the annular pumping channel 174. The annular chamber liner 179 also supports the confinement ring 110 in the lowered position of the heater pedestal 152. The chamber liner 179 also surrounds a circumference at the back of the heater pedestal 152. The chamber liner 179 rests on a narrow ledge in chamber body 120, but there is little other contact, so as to minimize thermal transport. Below the chamber liner 179 is located a Z-shaped lower chamber shield 121, made of opaque quartz. The lower chamber shield 121 rests on the bottom of chamber body 120 on an annular boss 177 formed on the bottom of the lower chamber shield 121. The quartz prevents radiative coupling between the bottom of the heater pedestal 152 and the chamber body 120. The annular boss 177 minimizes conductive heat transfer to the chamber body 120. In an alternative implementation, the lower chamber shield 121 includes an inwardly extending bottom lip joined to a conically shaped upper portion conforming to the inner wall of chamber body 120. While this alternative design is operationally satisfactory, the sloping shape is much more expensive to fabricate in quartz.

In one implementation, a remote plasma source 141 may be coupled to the processing chamber 150 through a gas port 132 to supply reactive plasma from the remote plasma source 141 through the plurality of holes 109 in the showerhead 156 to the processing chamber 150 to the substrate 102 surface. It is noted that the remote plasma source 141 may be coupled to the processing chamber 150 in any suitable position to supply a reactive remote plasma source to the substrate 102 surface as needed. The remote plasma source includes a power source, which can be any power source capable of producing sufficient energy to dissociate a gas resulting in the creation of cleaning radicals. The remote plasma source may include an RF power source. The RF power source may be a 13.56 MHz, 300-400 kV source. Suitable gases that may be supplied to the remote plasma source 141 to be dissociated and further delivered to the substrate 102 surface include hydrogen, argon, helium, nitrogen, ammonia, fluorine containing cleaning gas mixtures, other cleaning gases, combinations thereof and the like. In some implementations, the gas port 132 may be tapered.

In FIG. 1, a control unit 180 may be coupled to the chamber 150 to control processing conditions. The control unit 180 comprises a central processing unit (CPU) 182, support circuitry 184, and memory 186 containing associated control software 183. The control unit 180 may be one of any form of a general purpose computer processor that can be used in an industrial setting for controlling various chambers and sub-processors. The CPU 182 may use any suitable memory 186, such as random access memory, read only memory, floppy disk drive, compact disc drive, hard disk, or any other form of digital storage, local or remote. Various support circuits may be coupled to the CPU 182 for supporting the chamber 150. The control unit 180 may be coupled to another controller that is located adjacent individual chamber components. Bi-directional communications between the control unit 180 and various other components of the chamber 150 are handled through numerous signal cables collectively referred to as signal buses, some of which are illustrated in FIG. 1.

In some implementations, the flow rates in the present disclosure are expressed as sccm per interior chamber volume. The interior chamber volume is defined as the volume of the interior of the chamber in which a gas can occupy. For example, the interior chamber volume of chamber 150 is the volume defined by the chamber body 120 minus the volume occupied therein by the showerhead assembly 156 and by the heater pedestal 1521 pedestal stem 154.

Figure 2:
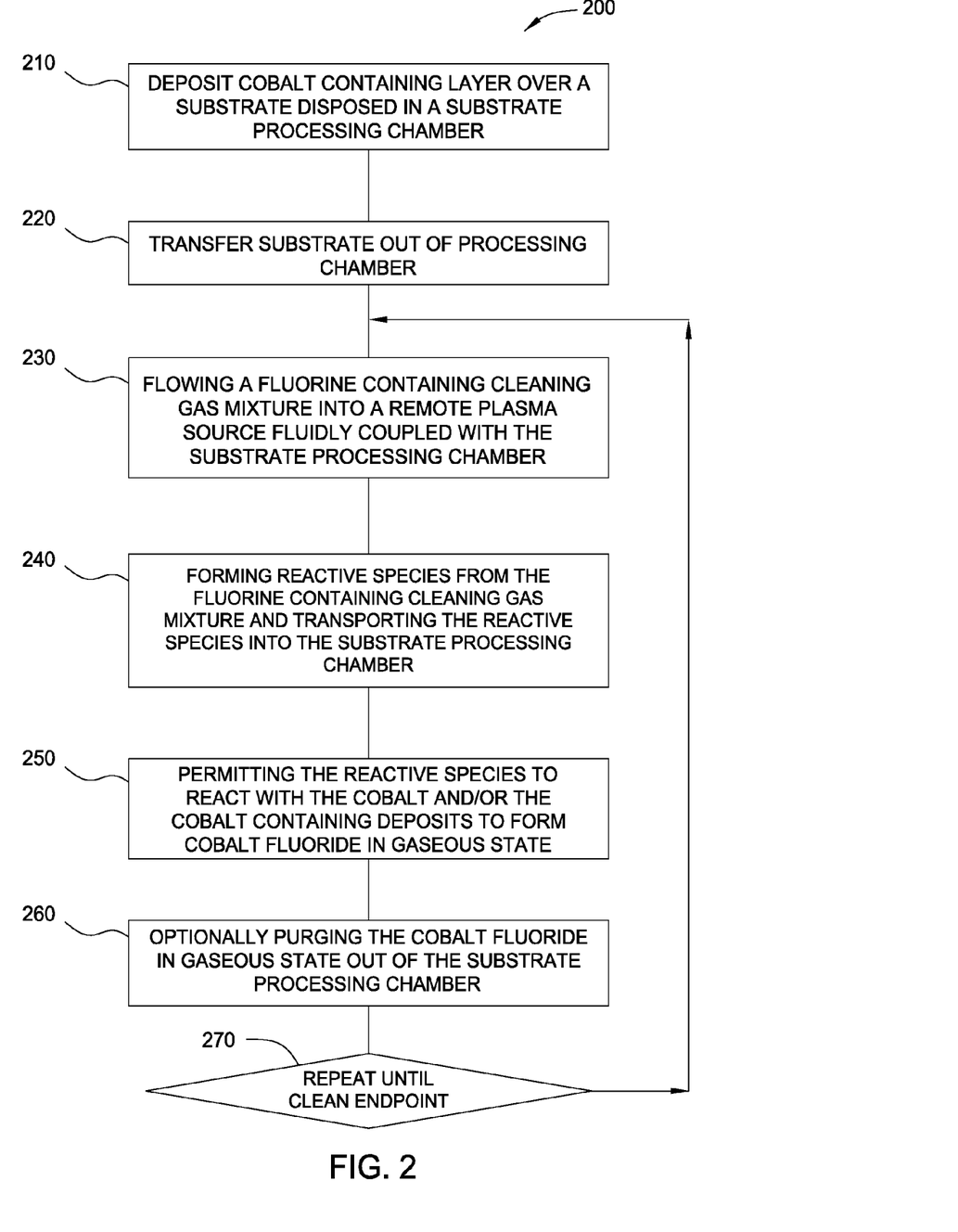
FIG. 2 is a flow chart depicting one implementation of a method that may be used to clean a metal deposition processing system.

FIG. 2 is a flow chart depicting one implementation of a method 200 that may be used to clean a metal deposition substrate processing system. The metal deposition substrate processing system may be similar to the substrate processing chamber 150 depicted in FIG. 1. At block 210, a cobalt containing layer is deposited over a substrate disposed in the substrate processing chamber. During deposition of the cobalt containing layer over the substrate, cobalt and/or cobalt containing compounds may be deposited over the interior surfaces including the chamber components of the substrate processing chamber. At block 220, the substrate is transferred out of the substrate processing chamber.

Next, an optional chamber heating process may be performed prior to and/or during the chamber cleaning process. Controlling the temperature may be used to control the removal/etching rate of the cobalt/cobalt containing deposits. The removal rate may increase as the chamber temperature increases. For example, in some implementations, elevating the temperature to 300 degrees Celsius may increase the etching rate to 50 Å/second. In some implementations, the chamber may be heated to a temperature greater than 50 degrees Celsius. In some implementations, the chamber may be heated to a temperature greater than 65 degrees Celsius. In some implementations, the chamber may be heated to between about 50 degrees Celsius and about 550 degrees Celsius. In some implementations, the chamber may be heated to between about 65 degrees Celsius and about 400 degrees Celsius. In some implementations, the chamber may be heated to between about 100 degrees Celsius and about 300 degrees Celsius. In some implementations, the chamber may be heated to between about 150 degrees Celsius and about 200 degrees Celsius. In some implementations, the chamber may be heated by heating the lid assembly 100 as described above. In some implementations, the chamber may be heated by heating the heater pedestal positioned in the chamber. The heater pedestal may be similar to heater pedestal 152. In some implementations, the chamber may be heated by heating both the lid assembly and the heater pedestal. In some implementations, the chamber may be heated by an in-situ plasma. In some implementations, the chamber temperature may be maintained at the same temperature used during deposition of the cobalt containing layer over the substrate.

At block 230, a fluorine containing gas mixture is flowed into a remote plasma source fluidly coupled with the substrate processing chamber. The fluorine containing gas mixture comprises a fluorine containing gas, an optional oxygen containing gas and an optional inert gas. In some implementations, the optional inert gas may function as a carrier gas. In some implementations, the optional inert gas may extend the lifetime of and increase the density of the radical species. In some implementations, the fluorine containing gas mixture is flowed into the remote plasma source and the other process gases are delivered to the chamber separately.

The fluorine containing gas may be selected from the group consisting of: $NF_3$, $ClF_3$, $F_2$, $CF_4$, $C_2F_6$, and combinations thereof. The oxygen containing gas may be selected from the group consisting of: $N_2O$, $O_2$, and combinations thereof. The optional inert gas may be selected from the group consisting of: helium, argon, and combinations thereof. In some implementations, the fluorine containing cleaning gas mixture comprises $NF_3$ and $N_2O$. In some implementations, the fluorine containing cleaning gas mixture comprises $NF_3$ and $O_2$.

The remote plasma source may be an inductively coupled plasma source. The remote plasma source accepts the fluorine containing cleaning gas mixture and forms a plasma in the fluorine containing cleaning gas mixture which causes dissociation of the of the fluorine containing cleaning gas mixture to form cleaning radicals. The cleaning radicals may include reactive species such as F atoms or $F^+$ atoms. The remote plasma source provides high efficiency dissociation of the fluorine containing cleaning gas mixture. In some implementations, a dissociation of the fluorine containing cleaning gas mixture of greater than 90% is achieved. In some implementations, a dissociation of greater than 40%, greater than 60% or greater than 80% is achieved.

In some implementations, the remote plasma is initiated with an initial flow of argon or similar inert gas before introducing the fluorine containing cleaning gas mixture into the remote plasma chamber.

The fluorine containing cleaning gas mixture may be flowed into the chamber at a flow rate of about 100 sccm to about 10,000 sccm. In some implementations, the fluorine containing cleaning gas mixture is flowed into the chamber at a flow rate from about 500 sccm to about 4,000 sccm. In some implementations, the fluorine containing cleaning gas mixture is flowed into the chamber at a flow rate of about 1,000 sccm.

The pressure within the substrate processing chamber may be between about 10 mTorr and about 300 Torr. The pressure within the substrate processing chamber may be between 1 Torr and about 10 Torr, for example, about 3 Torr.

In some implementations, the remote plasma is initiated with an initial flow of argon or similar inert gas before introducing $NF_3$ into the remote plasma chamber. Then, as $NF_3$ is introduced into the remote plasma chamber, the flow rate of argon is decreased. As an example, the remote plasma may be initiated with a flow of 3,000 sccm of argon which is progressively decreased to 1,000 and then to 500 sccm as $NF_3$ is introduced into the remote plasma chamber at an initial flow rate of 1,000 sccm and then increased to a flow of 1,500 sccm.

In some implementations, the heater pedestal is heated to a temperature greater than 50 degrees Celsius. In some implementations, the chamber may be heated to a temperature greater than 65 degrees Celsius. In some implementations, the heater pedestal may be heated to between about 65 degrees Celsius and about 400 degrees Celsius. In some implementations, the heater pedestal may be heated to between about 100 degrees Celsius and about 300 degrees Celsius. In some implementations, the heater pedestal may be heated to between about 150 degrees Celsius and about 200 degrees Celsius. In some implementations, during the cleaning process, the lid assembly 100 may be heated or maintained at a temperature within a range from about 65 degrees Celsius to about 400 degrees Celsius, preferably, from about 100 degrees Celsius to about 300 degrees Celsius, and more preferably, from about 150 degrees Celsius to about 200 degrees Celsius. In some implementations, both the heater pedestal and the lid assembly may be heated to the aforementioned temperatures during the cleaning process.

At block 240, reactive species formed from the fluorine containing gas mixture are transported to the substrate processing chamber. The reactive species include atomic fluorine.

At block 250, the reactive species react with the cobalt and/or cobalt containing deposits to form a cobalt fluoride in gaseous state. The cobalt fluoride may be selected from the group of: $Co(II)F_2$, $Co(III)F_3$, $Co(IV)F_4$, $CoNOF_x$, cobalt oxyfluorides and combinations thereof.

Optionally, at block 260, the cobalt fluoride in gaseous state is purged out of the substrate processing chamber. The substrate processing chamber may be actively purged by flowing a purge gas in the substrate processing chamber. Alternatively, or in addition to introducing the purge gas, the process chamber may be depressurized in order to remove the residual cleaning gas as well as any by-products from the processing chamber. The substrate processing chamber may be purged by evacuating the substrate processing chamber. The time period of the purge process should generally be long enough to remove the gaseous cobalt fluoride from the substrate processing chamber. The time period of cleaning gas flow should be generally long enough to remove the cobalt and cobalt containing deposits from the interior surfaces of the chamber including the chamber components.

At block 270, at least one of block 230, block 240, block 250, and block 260 are repeated until a desired cleaning endpoint is achieved. It should be understood that several cycles of cleaning may apply with an optional purge process performed in between cleaning cycles.

Figure 3:
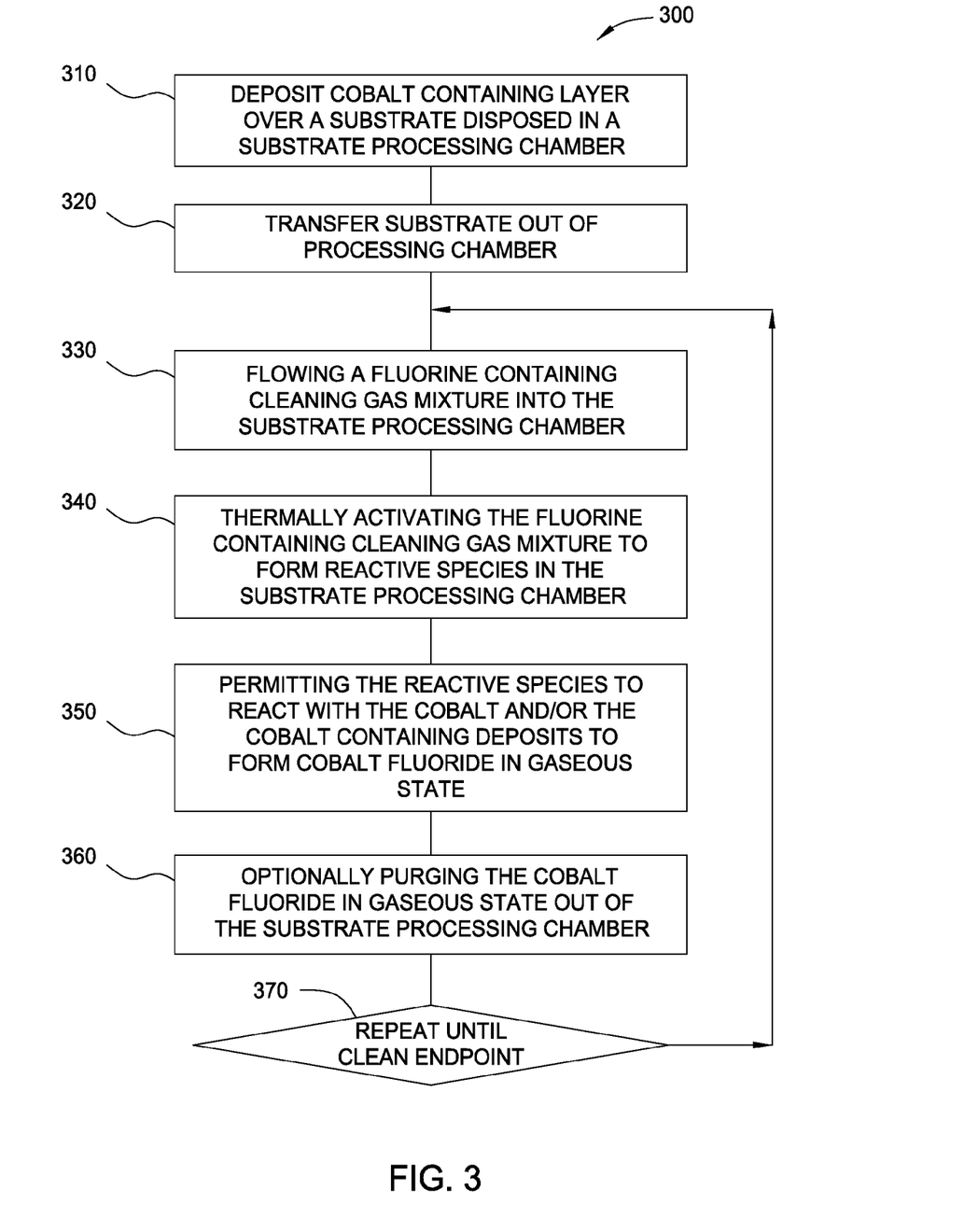
FIG. 3 is a flow chart depicting one implementation of another method that may be used to clean a metal deposition processing system.

FIG. 3 is a flow chart depicting one implementation of another method 300 that may be used to clean a metal deposition processing system. The metal deposition system may be similar to the substrate processing chamber 150 depicted in FIG. 1. The method 300 may be similar to the method 200 except that the method 300 does not use a remote plasma source to form reactive species but rather uses thermal activation within the substrate processing chamber to form reactive species from the fluorine containing cleaning gas mixture. At block 310, a cobalt containing layer is deposited over a substrate disposed in a substrate processing chamber. During deposition of the cobalt containing layer over the substrate, cobalt and/or cobalt containing compounds may be deposited over the interior surfaces including the chamber components of the substrate processing chamber. At block 320, the substrate is transferred out of the substrate processing chamber.

Next, an optional chamber heating process may be performed prior to cleaning the chamber. The chamber is heated to a temperature that will thermally activate (i.e., form reactive species) the fluorine containing cleaning gas mixture. In some implementations, the chamber may be heated to a temperature greater than 50 degrees Celsius. In some implementations, the chamber may be heated to a temperature greater than 65 degrees Celsius. In some implementations, the chamber may be heated to between about 50 degrees Celsius and about 550 degrees Celsius. In some implementations, the chamber may be heated to between about 65 degrees Celsius and about 400 degrees Celsius. In some implementations, the chamber may be heated to between about 100 degrees Celsius and about 300 degrees Celsius. In some implementations, the chamber may be heated to between about 150 degrees Celsius and about 200 degrees Celsius. In some implementations, the chamber may be heated by heating the lid assembly 100 as described above. In some implementations, the chamber may be heated by heating the heater pedestal positioned in the chamber. The heater pedestal may be similar to heater pedestal 152. In some implementations, the chamber may be heated by heating both the lid assembly and the heater pedestal. In some implementations, the chamber may be heated by an in-situ plasma. In some implementations, the chamber temperature may be maintained at the same temperature used during deposition of the cobalt containing layer over the substrate.

At block 330, a fluorine containing cleaning gas mixture is flowed into the substrate processing chamber. The fluorine containing cleaning gas mixture comprises a fluorine containing gas, an optional oxygen containing gas and an optional inert gas. In some implementations, the optional inert gas may function as a carrier gas. In some implementations, the optional inert gas may extend the lifetime of and increase the density of the radical species. In some implementations, the fluorine containing cleaning gas mixture may be thermally activated by exposing the fluorine containing cleaning gas mixture to a heated inert gas. In some implementations, the components of the fluorine containing gas mixture are flowed into the substrate processing chamber separately and mixed within the substrate processing chamber.

The fluorine containing cleaning gas mixture may be selected from the group consisting of: $ClF_3$, $F_2$, and combinations thereof. The oxygen containing gas may be selected from the group consisting of: $N_2O$, $O_2$, and combinations thereof. The optional inert gas may be selected from the group consisting of: helium, argon, and combinations thereof. In some implementations, the fluorine containing cleaning gas mixture comprises $ClF_3$ and He. In some implementations, the fluorine containing cleaning gas mixture comprises $ClF_3$ and Ar.

The fluorine containing cleaning gas mixture may be flowed into the chamber at a flow rate of about 100 sccm to about 10,000 sccm. In some implementations, the fluorine containing cleaning gas mixture is flowed into the chamber at a flow rate from about 500 sccm to about 4,000 sccm. In some implementations, the fluorine containing cleaning gas mixture is flowed into the chamber at a flow rate of about 1,000 sccm.

The pressure within the substrate processing chamber may be between about 10 mTorr and about 100 Torr. The pressure within the substrate processing chamber may be between 20 Torr and about 30 Torr, for example, about 25 Torr.

In some implementations the thermal activation is initiated by introducing $ClF_3$ into the plasma with a flow of 3,000 sccm of argon which is progressively decreased to 1,000 and then to 500 sccm as $ClF_3$ is introduced into the substrate processing chamber at an initial flow rate of 1,000 sccm and then increased to a flow of 1,500 sccm.

In some implementations, the heater pedestal is heated to a temperature greater than 50 degrees Celsius. In some implementations, the chamber may be heated to a temperature greater than 65 degrees Celsius. In some implementations, the heater pedestal may be heated to between about 65 degrees Celsius and about 400 degrees Celsius. In some implementations, the heater pedestal may be heated to between about 100 degrees Celsius and about 300 degrees Celsius. In some implementations, the heater pedestal may be heated to between about 150 degrees Celsius and about 200 degrees Celsius. In some implementations during the cleaning process, the lid assembly 100 may be heated or maintained at a temperature within a range from about 65 degrees Celsius to about 400 degrees Celsius, preferably, from about 100 degrees Celsius to about 300 degrees Celsius, and more preferably, from about 150 degrees Celsius to about 200 degrees Celsius. In some implementations, both the heater pedestal and the lid assembly may be heated to the aforementioned temperatures during the cleaning process.

At block 340, the fluorine containing cleaning gas mixture is thermally activated to form the reactive species in the substrate processing chamber. In some implementations, the fluorine containing cleaning gas mixture may be thermally activated outside of the substrate processing chamber and the reactive species are delivered to the substrate processing chamber. During the thermal activation process, the fluorine containing cleaning gas mixture is heated to a temperature to dissociate the fluorine containing cleaning gas mixture into the cleaning radicals/reactive species.

At block 350, the reactive species react with the cobalt and/or cobalt containing deposits to form cobalt fluoride in a gaseous state. The cobalt fluoride may be selected from the group of; $Co(II)F_2$, $Co(III)F_3$, $Co(IV)F_4$, and combinations thereof.

Optionally, at block 360, the cobalt fluoride in gaseous state is purged out of the substrate processing chamber. The substrate processing chamber may be actively purged by flowing a purge gas in the substrate processing chamber. Alternatively, or in addition to introducing the purge gas, the process chamber may be depressurized in order to remove the residual cleaning gas as well as any by-products from the processing chamber. The substrate processing chamber may be purged by evacuating the substrate processing chamber. The time period of the purge process should generally be long enough to remove the gaseous cobalt fluoride from the substrate processing chamber. The time period of cleaning gas flow should be generally long enough to remove the cobalt and cobalt containing deposits from the interior surfaces of the chamber including the chamber components.

At block 370, at least one of block 330, block 340, block 350, and block 360 are repeated until a desired cleaning endpoint is achieved. It should be understood that several cycles of cleaning may apply with an optional purge process performed in between cleaning cycles.

Figure 4:
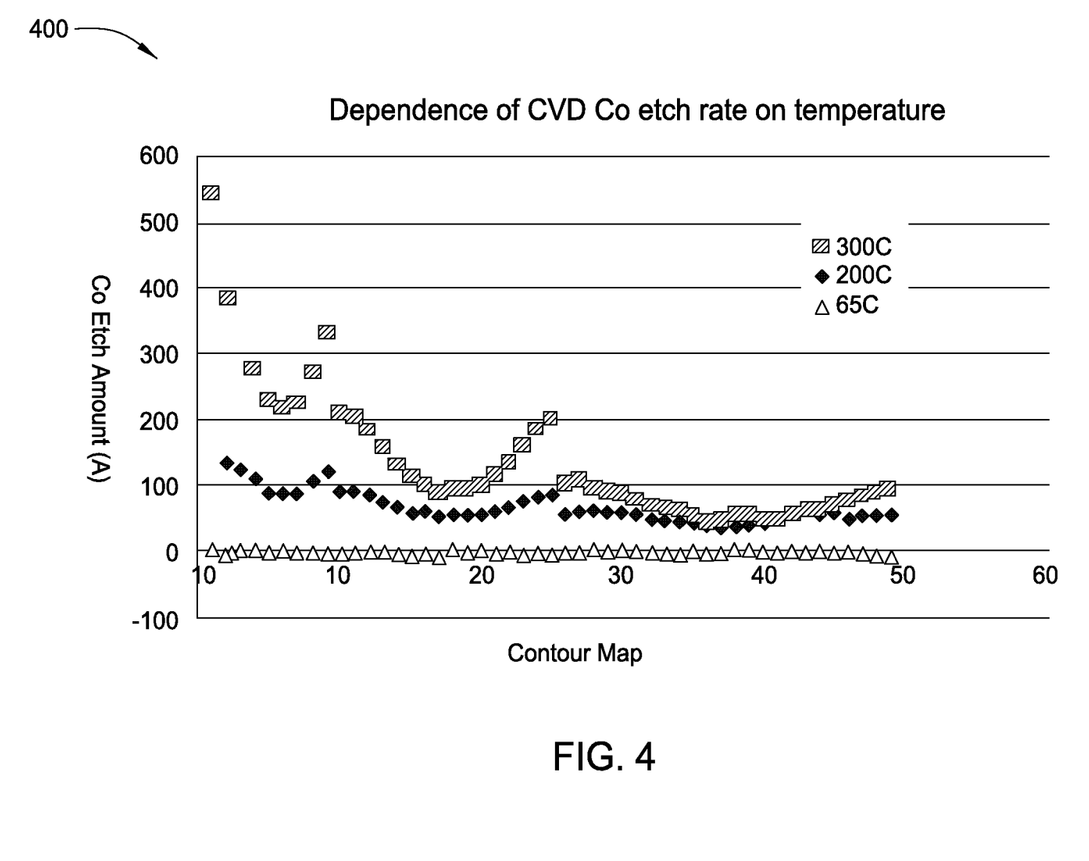
FIG. 4 is a plot depicting the dependence of Cobalt etch rate on temperature.

FIG. 4 is a plot 400 depicting the dependence of Cobalt etch rate on temperature. The y-axis represents the cobalt thickness removed for an etch time of 10 seconds. The x-axis represents points of measurement across the substrate. Data points higher than 26 represent points at 3 millimeters from the edge of the substrate all around the substrate. Points at numbers less than 26 represent measurement points of the inner portion of the substrate. Point 0 represents the center of the wafer. The depicted etch rates were achieved by performing the remote plasma $NF_3$ clean processes described herein. As depicted in FIG. 4, there was minimal etching of cobalt at a temperature of 65 degrees Celsius, moderate etching of cobalt at a temperature of 200 degrees Celsius, and significant etching of cobalt at 300 degrees Celsius.

While the foregoing is directed to implementations of the present disclosure, other and further implementations of the disclosure may be devised without departing from the basic scope thereof, and the scope thereof is determined by the claims that follow.

The invention claimed is:

1. A method for removing cobalt or cobalt containing deposits from one or more interior surfaces of a substrate processing chamber after processing a substrate disposed in the substrate processing chamber, the method comprising:
   depositing a cobalt or cobalt containing layer on the one or more interior surfaces and a substrate disposed in the substrate processing chamber;
   transferring the substrate out of the substrate processing chamber;
   flowing argon gas into a remote plasma source fluidly coupled with the substrate processing chamber at a first flow rate;
   flowing a fluorine containing cleaning gas mixture into the remote plasma source while reducing a flow rate of the argon gas from the first flow rate to a second flow rate, forming reactive species from the fluorine containing cleaning gas mixture and transporting the reactive species into the substrate processing chamber;
   permitting the reactive species to react with the cobalt and/or the cobalt containing deposits on the one or more interior surfaces to form cobalt fluoride in a gaseous state; and
   purging the cobalt fluoride in gaseous state out of the substrate processing chamber.

2. The method of claim 1, wherein the fluorine containing cleaning gas mixture comprises a fluorine containing gas selected from the group consisting of: $NF_3$, $ClF_3$, $F_2$, and combinations thereof.

3. The method of claim 1, wherein the fluorine containing cleaning gas mixture comprises $NF_3$ and $N_2O$.

4. The method of claim 1, wherein the fluorine containing cleaning gas mixture comprises $NF_3$ and $O_2$.

5. The method of claim 1, wherein the reactive species comprises atomic fluorine.

6. The method of claim 1, further comprising heating the substrate processing chamber to between about 100 degrees Celsius and about 300 degrees Celsius prior to transporting the reactive species into the substrate processing chamber.

7. The method of claim 2, wherein the cobalt fluoride is selected from the group consisting of: $Co(II)F_2$, $Co(III)F_3$, $Co(IV)F_4$, cobalt oxyfluorides, and combinations thereof.

8. The method of claim 2, wherein the fluorine containing cleaning gas mixture further comprises an oxygen containing gas.

9. The method of claim 5, wherein the remote plasma source is an inductively coupled plasma source.

10. The method of claim 8, wherein the oxygen containing gas is selected from the group consisting of: $N_2O$, $O_2$, and combinations thereof.

11. The method of claim 10, wherein the fluorine containing cleaning gas mixture further comprises helium.

* * * * *